United States Patent
Ban

(10) Patent No.: US 7,651,950 B2
(45) Date of Patent: Jan. 26, 2010

(54) METHOD FOR FORMING A PATTERN OF A SEMICONDUCTOR DEVICE

(75) Inventor: Keun Do Ban, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/165,388

(22) Filed: Jun. 30, 2008

(65) Prior Publication Data

US 2009/0087959 A1    Apr. 2, 2009

(30) Foreign Application Priority Data

Sep. 28, 2007  (KR) .................... 10-2007-0098451
Jun. 25, 2008  (KR) .................... 10-2008-0060486

(51) Int. Cl.
*H01L 21/302* (2006.01)
*H01L 21/461* (2006.01)

(52) U.S. Cl. ............... 438/725; 438/553; 438/717; 257/E21.25; 257/E21.229; 257/E21.304; 257/E21.292; 257/E21.64

(58) Field of Classification Search ................. 438/238, 438/381, 553, 622, 706, 717, 725, 745, 692, 438/789, 790
See application file for complete search history.

(56) References Cited

U.S. PATENT DOCUMENTS

| 6,613,621 | B2 * | 9/2003 | Uh et al. ................ 438/183 |
| 6,723,607 | B2 * | 4/2004 | Nam et al. .............. 438/275 |
| 2003/0230234 | A1 * | 12/2003 | Nam et al. .............. 117/97 |
| 2008/0233729 | A1 * | 9/2008 | Jung ..................... 438/594 |
| 2009/0075485 | A1 | 3/2009 | Ban et al. |

FOREIGN PATENT DOCUMENTS

KR    10-0905157    6/2009

* cited by examiner

*Primary Examiner*—David Nhu
(74) *Attorney, Agent, or Firm*—Townsend and Townsend and Crew LLP

(57) ABSTRACT

In a method for forming a fine pattern of a semiconductor device, forming a spacer for double patterning of a cell region is performed separate from forming a mask pattern that defines a dummy pattern for a pad of a peripheral circuit region.

17 Claims, 7 Drawing Sheets

(i)

(ii)

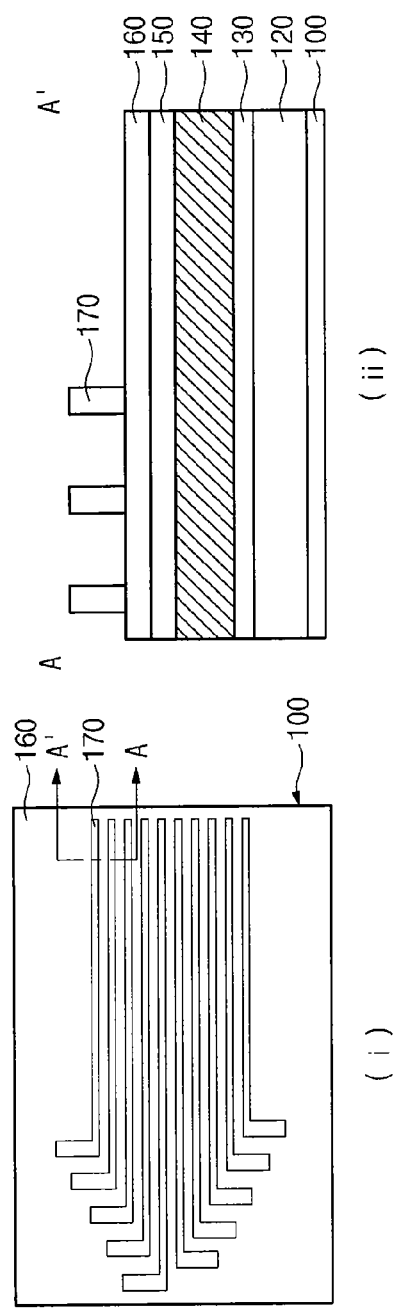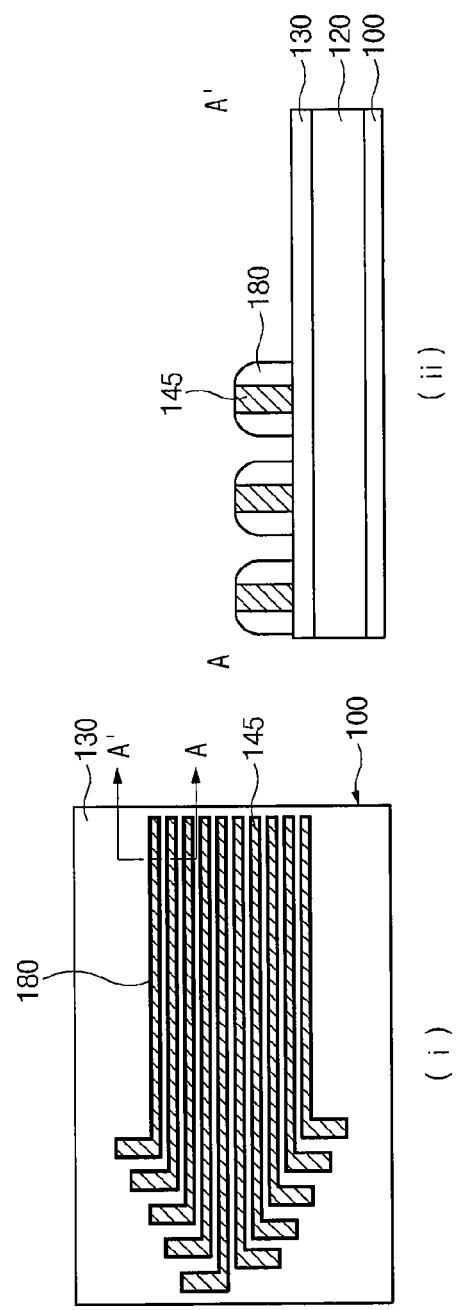
Fig.1a
Fig.1b

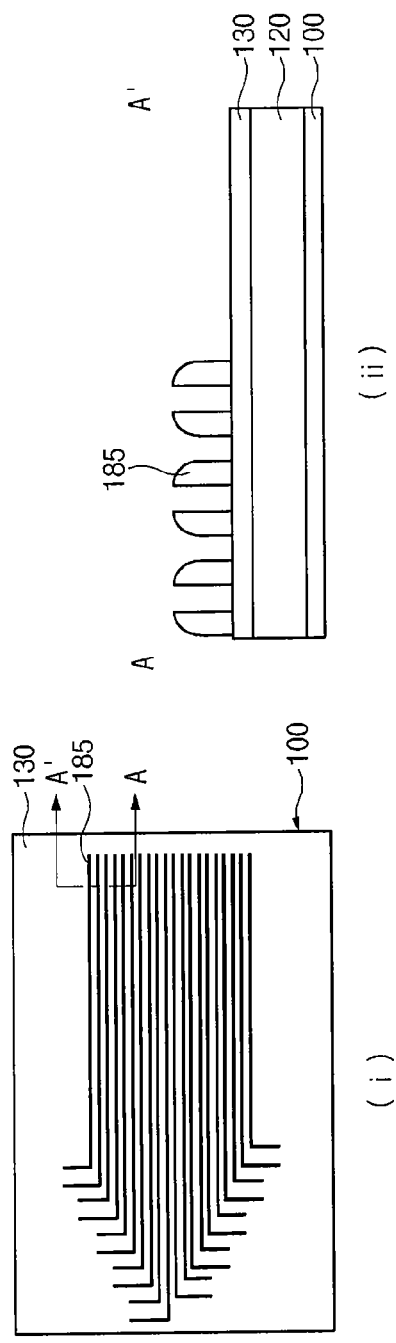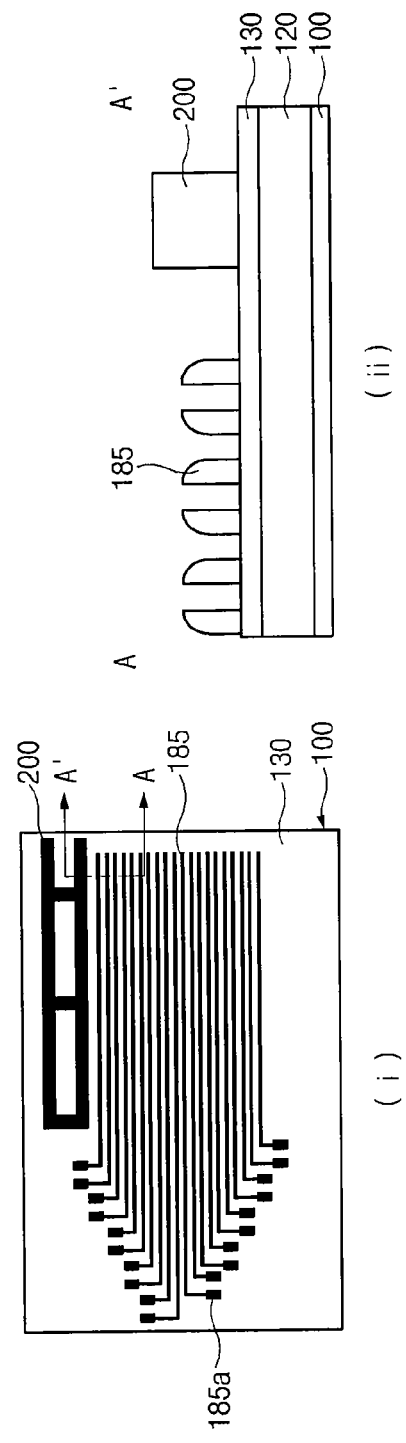
Fig.1e
Fig.1f

METHOD FOR FORMING A PATTERN OF A SEMICONDUCTOR DEVICE

CROSS-REFERENCES TO RELATED APPLICATIONS

Priority is claimed to Korean patent application number 10-2007-0098451, filed on Sep. 28, 2007, and Korean patent application number 10-2008-0060486, filed on Jun. 25, 2008, which is incorporated by reference in its entirety.

BACKGROUND OF THE INVENTION

The present invention relates to a method for forming a fine pattern of a semiconductor device, and more specifically, to preventing a defect generated from first and second mask processes in a double exposure process to overcome a resolution limit of an exposer.

As semiconductor devices become smaller and more highly-integrated, the chip area is increased in proportion to an increase of memory capacity, but an area of a cell region where a pattern of the semiconductor device is formed is decreased. Since more patterns are required in a limited cell region in order to secure a desired memory capacity, a critical dimension (CD) of the pattern is decreased so that the pattern becomes finer.

A lithography process is commonly used to obtain a pattern having a smaller CD. The lithography process includes: coating a photoresist over a substrate; exposing the photoresist with an exposure mask having a fine pattern by using a light source having a wavelength of 365 nm, 248 nm, 193 nm and 153 nm; and performing a development process to form a photoresist pattern that defines the fine pattern.

In the lithography process, the resolution (R) is determined depending on a wavelength ($\lambda$) and a numerical aperture (NA) of the light source as shown in the equation $R = k1 \times \lambda / NA$. In the equation, k1 is a process constant having a physical limit, so that it cannot be decreased by a general method. A new photoresist material having a high reactivity to short wavelengths is required with an exposer using the short wavelengths, so that it is difficult to form a fine pattern having a CD less than a short wavelength.

As a result, 'a double patterning technology' has been developed for overlapping patterns under consideration of an exposer to obtain a fine pattern.

The double patterning process includes forming a first hard mask over a semiconductor substrate. The first hard mask defines a CD three times larger than that of a fine pattern. A second hard mask is formed over the first hard mask such that it is aligned alternately with the first hard mask, thereby obtaining a fine pattern by the first and second hard masks. However, a process margin for aligning the first hard mask and the second hard mask accurately is decreased to reduce a margin of the double patterning process.

In order to prevent decrease of the margin, a sacrificial oxide pattern is formed, and a spacer is formed on sidewalls of the oxide pattern so that the spacer may be used as a hard mask that defines a fine pattern. Although the method for forming a fine pattern using the spacer may improve a process margin for forming a fine pattern, a dummy pattern also becomes smaller to generate a defect of the dummy pattern.

As mentioned above, in the conventional method for forming a fine pattern of a semiconductor device, it is difficult to form a fine pattern having a small CD due to limits of the resolution of the exposer. In the double exposure process for overcoming the limits, patterns may be misaligned in a mask forming process that is performed twice. Although a method for forming a fine pattern using a spacer is developed, a dummy pattern is also defined in a spacer hard mask forming process for forming a fine pattern. As a result, the dummy pattern is deteriorated, and yield and reliability of the semiconductor device is degraded.

BRIEF SUMMARY OF THE INVENTION

Various embodiments of the present invention are directed to a method for forming a fine pattern of a semiconductor device by using a spacer. In the method, a spacer that defines a fine pattern is formed separate from forming a mask pattern that defines a dummy pattern. The method for forming a hard mask pattern that defines a fine pattern with a spacer improves yield and reliability of the semiconductor device.

According to an embodiment of the present invention, a method for forming a fine pattern of a semiconductor device comprises: defining a cell region and a peripheral circuit region in a semiconductor substrate; forming an underlying layer over the semiconductor substrate; forming a sacrificial pattern over the underlying layer in the cell region; forming a spacer on sidewalls of the sacrificial pattern; removing the sacrificial pattern to form a spacer pattern; forming a mask pattern that defines a peripheral circuit pattern over the underlying layer in the peripheral circuit region; and patterning the underlying layer in the cell region and the peripheral circuit region with the spacer pattern and a photoresist pattern to obtain a cell pattern and a peripheral circuit pattern.

The method further comprises forming an alignment key or an overlay vernier pattern in a scribe lane when forming the spacer pattern.

The mask pattern defines a dummy pattern to have an embossed or engraved type.

A method for forming a fine pattern of a semiconductor device comprises: forming a first hard mask layer over a semiconductor substrate; forming an etching barrier film over the first hard mask layer; forming a sacrificial film over the etching barrier film; forming a second hard mask layer over the sacrificial film; patterning the second hard mask layer to form a second hard mask pattern such that a fine pattern is defined by a spacer region; etching the sacrificial film with the second hard mask pattern to form a sacrificial pattern; removing the second hard mask pattern to form a spacer on sidewalls of the sacrificial pattern; removing the sacrificial pattern to form a spacer pattern; forming a photoresist pattern that defines a dummy pattern for forming a pad in an outer region of the spacer pattern; etching the etching barrier film and the first hard mask layer using the spacer pattern and the photoresist pattern as a mask; and removing the spacer pattern, the photoresist pattern and the etching barrier film to form a first hard mask pattern that defines the fine pattern.

BRIEF DESCRIPTION OF THE DRAWINGS

FIGS. 1a to 1g are diagrams illustrating a method for forming a fine pattern of a semiconductor device according to an embodiment of the present invention.

DESCRIPTION OF EMBODIMENTS

Hereinafter, a process of forming a flash gate on a cell region and forming a dummy pattern on a peripheral region in a semiconductor device will be explained referring to FIGS. 1a-1g. Then a process of forming an alignment key or overlay vernier (hereinafter, 'alignment key') on a peripheral region in a semiconductor device will be explained referring to FIG. 2. And forming an alignment key on a peripheral region in semiconductor device will be explained referring to FIGS. 3a-4b.

Figure 1C:
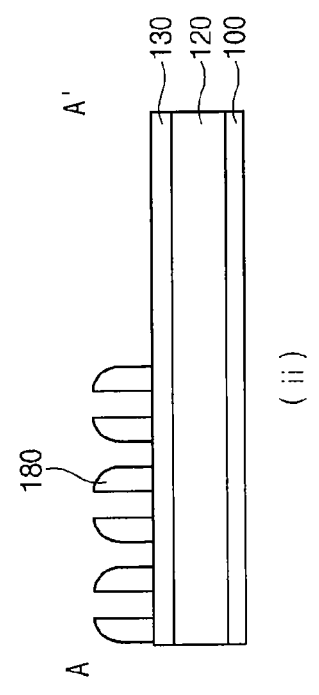
Figure 1C:
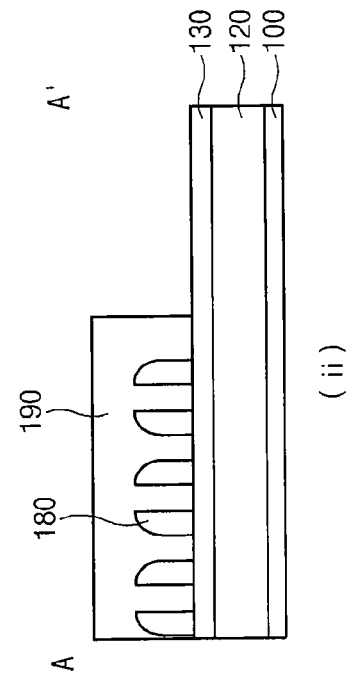
Figure 1C:
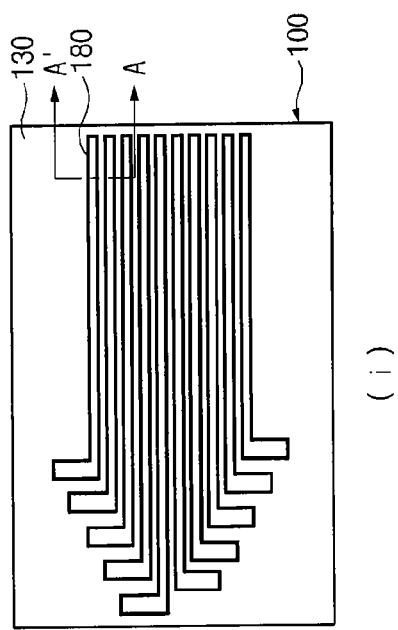

FIGS. 1a to 1g are diagrams illustrating a method for forming a fine pattern of a semiconductor device according to an embodiment of the present invention. FIGS. 1a(i) to 1g(i) show plane views, and FIGS. 1a(ii) to 1g(ii) show cross-sectional views taken along A-A' of FIGS. 1a(i) to 1g(i).

Referring to FIG. 1a, a first hard mask layer 120 is formed over a semiconductor substrate 100. An underlying layer (not shown) such as a gate material layer may be disposed between the first hard mask layer 120 and the semiconductor substrate 100.

An etching barrier film 130 is formed over the first hard mask layer 120, and a sacrificial film 140 is formed over the etching barrier film 130. A second hard mask layer 150 is formed over the sacrificial film 140. An anti-reflection film 160 is formed over the second hard mask layer 150. A first photoresist pattern 170 defined as a flash gate type which is a fine pattern is formed over the anti-reflection film 160. The first photoresist pattern 170 may be formed to have a line pattern.

As shown in FIG. 1a(i), an end portion of the first photoresist pattern 170 is curved with a 'L' type shape in order to prevent collapse of the first photoresist pattern 170 having a line pattern.

Referring to FIG. 1b, the anti-reflection film 160 and the second hard mask layer 150 are etched using the first photoresist pattern 170 as a mask to form a second hard mask pattern (not shown) that defines a line/space. After the first photoresist pattern 170 is removed, the sacrificial film 140 is etched using the second hard mask pattern as a mask to form a sacrificial pattern 145 that defines a flash gate.

After a spacer material layer (not shown) having an etching selectivity different from that of the sacrificial pattern 145 is formed over the semiconductor substrate 100, an etch-back process is performed to form a first spacer 180 on sidewalls of the sacrificial pattern 145. A critical dimension (CD) of the first spacer 180 is a CD of a fine pattern (flash gate) formed in a subsequent process.

Figure 1D:
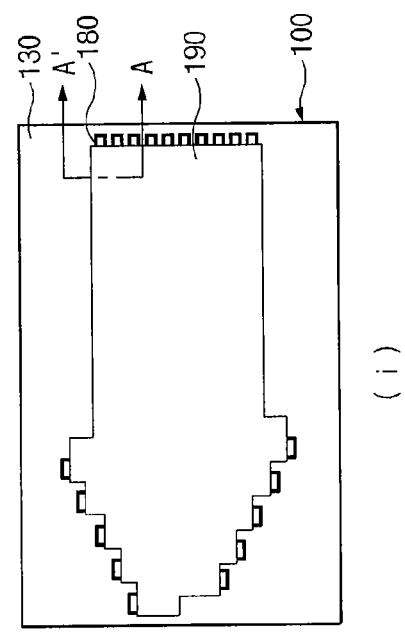

Referring to FIG. 1c, the sacrificial pattern 145 is removed by a wet etching or dry etching process. Referring to FIG. 1d, a second photoresist pattern 190 is formed which exposes both end portions of the line pattern formed by the first spacer 180 over the semiconductor substrate 100.

Referring to FIG. 1e, both end portions of the spacer 180 pattern exposed by the second photoresist pattern 190 are removed to separate a first spacer pattern, thereby obtaining a second spacer pattern 185 that defines a flash gate. Then the second photoresist pattern 190 is removed.

Referring to FIG. 1f, a third photoresist pattern 200 that defines a pad is formed over the etching barrier film 130 including the second spacer pattern 185. Referring to FIG. 1f(i), the third photoresist pattern 200 that defines a pad is disposed in a peripheral circuit region of the semiconductor substrate 100. A supporting pattern 185a can be further disposed in the 'L'-curved edge portion of the spacer pattern 185.

As shown in FIG. 1f, a pattern that defines a flash gate in a cell region is formed by a spacer patterning process. And the third photoresist pattern 200 that defines a dummy pattern for pad in a peripheral circuit region is formed by a single patterning process without a spacer. As a result, when the dummy pattern for a pad of the peripheral circuit region is formed using a spacer, collapse or lifting of the dummy pattern due to its thin thickness can be prevented.

Figure 1G:
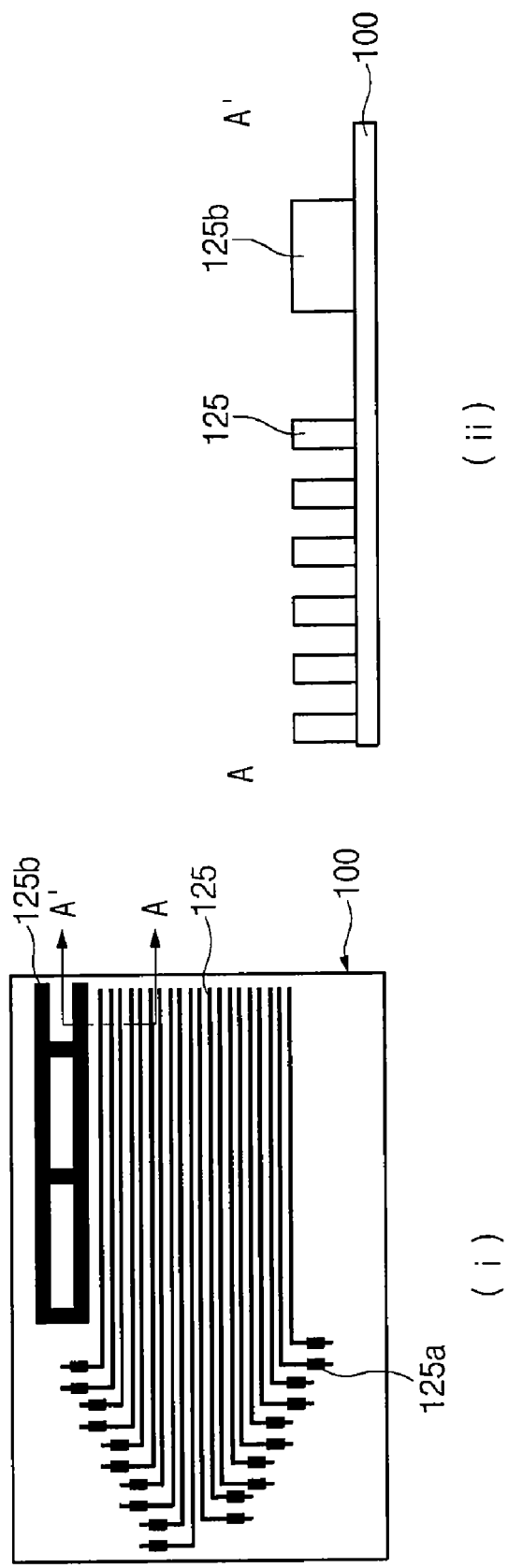

As shown in FIG. 1g, the etching barrier film 130 and the first hard mask layer 120 are etched using the spacer pattern 185 and the third photoresist pattern 200 as a mask to form first to third hard mask patterns 125, 125a, 125b. Specifically, the first hard mask pattern 125 that defines a flash gate which is a fine pattern, the second hard mask pattern 125a that defines a supporting pattern for preventing collapse, and the third hard mask pattern 125b that defines a dummy pattern are formed. the mask patterns may comprise an organic film, an inorganic film and a deposition pattern including the organic film and the inorganic film.

The spacer pattern 185 and the third photoresist pattern 200 are removed, and the semiconductor substrate 100 is etched using the first to third hard mask patterns 125, 125a, 125b as a mask to form a flash gate (not shown), a supporting pattern (not shown) and a dummy pattern (not shown).

As explained above, a flash gate and a dummy pattern are formed in the method for forming pattern of a semiconductor device according to the present invention. Hereinafter, a process of forming an alignment key on a peripheral region is described referring to FIG. 2.

Figure 2:
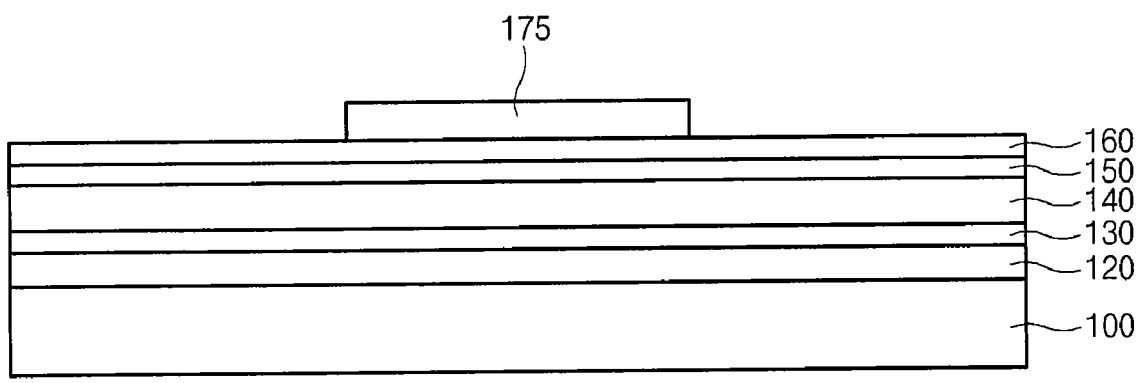
FIG. 2 is a cross-sectional diagram illustrating a process for forming an alignment key in the method for forming a fine pattern according to an embodiment of the present invention.

FIG. 2 is a cross-sectional diagram illustrating a process for forming an alignment key in the method for forming a fine pattern according to an embodiment of the present invention. Specifically, FIG. 2 illustrates that a first mask pattern 175 for forming an alignment key in the peripheral circuit region is formed when the first mask pattern that defines a fine pattern is formed over the semiconductor substrate in FIG. 2.

The alignment key is defined by a spacer pattern 175a (see FIGS. 3a and 3b) formed on sidewalls of the first mask pattern 175. The alignment key is relatively less affected by a CMP or etching process because the size and distribution range of the alignment key pattern are relatively large. As a result, the alignment key 175 may be previously formed from the beginning for defining the first photoresist pattern 170 in the cell region as shown in FIG. 1. Thereafter, the processes of FIGS. 1b to 1g may be performed as described in the method for forming a fine pattern of the cell region.

Figure 3A:
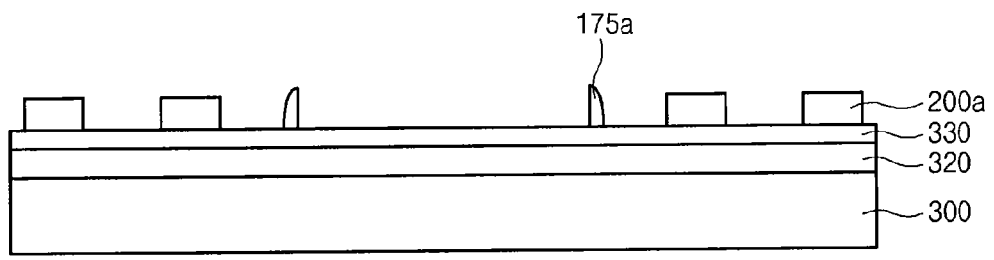
FIGS. 3a and 3b are cross-sectional diagrams illustrating a process for forming a dummy pattern in a method for forming a fine pattern of a semiconductor device according to an embodiment of the present invention.
Figure 3B:
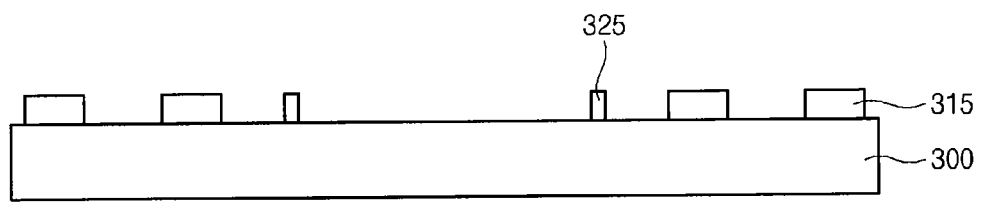
Figure 4A:
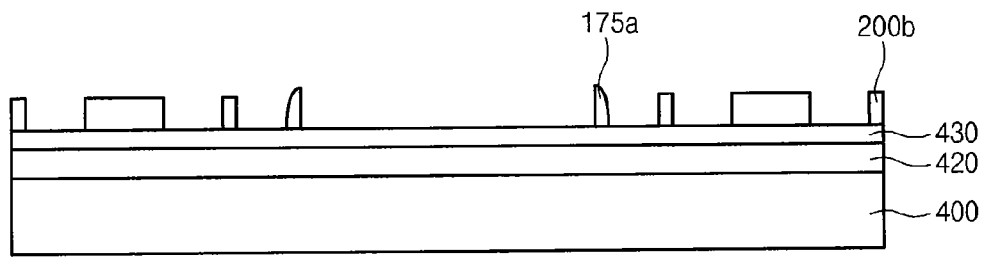
FIGS. 4a and 4b are cross-sectional diagrams illustrating a process for forming a dummy pattern in a method for forming a fine pattern of a semiconductor device according to an embodiment of the present invention.
Figure 4B:
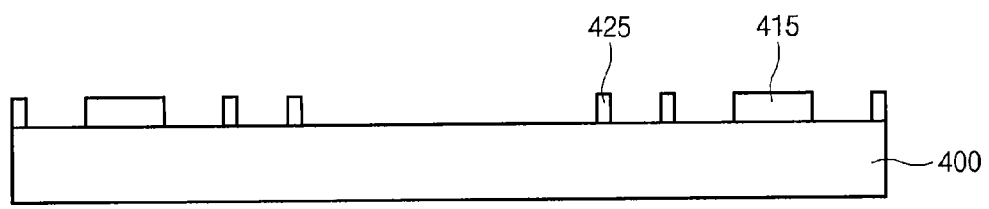

FIGS. 3a and 4b are cross-sectional diagrams illustrating a process for forming a dummy pattern and an alignment key in a peripheral circuit region. FIGS. 3a to 4b correspond to the processes for forming 'a pattern for a flash gate on a cell region (FIG. 1e)' and 'a dummy pattern for a pad on a peripheral region (FIG. 1f)'.

FIGS. 3a and 3b are cross-sectional diagrams illustrating a dummy pattern according to a first embodiment of the present invention. FIG. 3a shows a process for forming a dummy pattern 200a that defines a pad in a peripheral circuit region after the processes of FIG. 1a to 1e are performed in the cell region.

Referring to FIG. 3a, a photoresist pattern 200a that defines a dummy pattern for a pad is formed over an etching barrier film 330 including an alignment key pattern 175a in a peripheral circuit region.

Referring to FIG. 3b, the etching barrier film 330 and a first hard mask layer 320 are etched using the alignment key pattern 175a and the photoresist pattern 200a as a mask to form a first hard mask pattern (not shown). Then a semiconductor substrate 300 is etched using the first hard mask pattern as a mask to form a dummy pattern 315 and an alignment key 325.

FIGS. 4a and 4b are cross-sectional diagrams illustrating a dummy pattern according to a second embodiment of the present invention. Like FIG. 3a, FIG. 4a shows a process for forming a dummy pattern 200b that defines a pad in a peripheral circuit region after the processes of FIG. 1a to 1e are performed in the cell region.

Referring to FIG. 4a, a photoresist pattern 200b that defines a dummy pattern 415 for a pad is formed over an etching barrier film 430 including an alignment key pattern 175a in a peripheral circuit region.

Referring to FIG. 4b, the etching barrier film 430 and a first hard mask layer 420 are etched using the alignment key pattern 175a and the photoresist pattern 200b as a mask to form a first hard mask pattern (not shown) similarly to the process shown in FIG. 3b. Then a semiconductor substrate 400 is etched using the first hard mask pattern (not shown) as a mask to form a dummy pattern 415 and an alignment key 425.

In the embodiments shown in FIGS. 3a, 3b and FIGS. 4a, 4b, although the process for forming the alignment keys 325 and 425 is the same, the photoresist patterns 200a and 200b for forming the dummy patterns 315 and 415 are symmetrical with each other. Each photoresist pattern 200a and 200b is formed with the same reticle using a positive resist and a negative resist.

As described above, in a method for forming a fine pattern of a semiconductor device according to an embodiment of the present invention, forming a spacer for double patterning of a cell region is performed separate from forming a mask pattern that defines a dummy pattern for a pad of a peripheral circuit region. When the spacer of the cell region is formed with the dummy pattern for a pad of the peripheral circuit region, the dummy pattern is degraded so that a hard mask pattern that defines the dummy pattern may not be normally formed. As a result, the method can increase process yield and reliability of the semiconductor device.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a fine pattern of a semiconductor device, comprising:
    defining a cell region and a peripheral circuit region of a semiconductor substrate:
    forming a gate material layer over the semiconductor substrate:
    forming a sacrificial pattern over the gate material layer in the cell region:
    forming a spacer on sidewalls of the sacrificial pattern, wherein the spacer is formed by:
        forming a spacer pattern including two adjacent line-type spacer patterns which are connected with each other,
        forming a first photoresist pattern that exposes both end portions of a line pattern formed by the spacer over the semiconductor substrate, and
        etching the exposed spacer using the first photoresist pattern as a mask to separate the connected spacer patterns,
    removing the sacrificial pattern;
    forming a mask pattern that defines a peripheral circuit pattern over the gate material layer in the peripheral circuit region; and
    patterning the gate material layer of the cell region and the peripheral circuit region with the spacer pattern and a second photoresist pattern to obtain a cell pattern and a peripheral circuit pattern.

2. The method for forming a fine pattern of a semiconductor device according to claim 1, further comprising forming an alignment key or an overlay vernier pattern in a scribe lane when forming the spacer pattern.

3. The method for forming a fine pattern of a semiconductor device according to claim 1, wherein a photoresist pattern of the peripheral circuit region is formed using a positive resist.

4. The method for forming a fine pattern of a semiconductor device according to claim 1, wherein a photoresist pattern of the peripheral circuit region is formed using a negative resist.

5. The method for forming a fine pattern of a semiconductor device according to claim 1, wherein at least one end portion of the sacrificial pattern is curved at a predetermined angle.

6. The method for forming a fine pattern of a semiconductor device according to claim 1, wherein the mask pattern comprises an organic film, an inorganic film and a deposition pattern including the organic film and the inorganic film.

7. The method for forming a fine pattern of a semiconductor device according to claim 1, wherein the forming-a-spacer includes:
    forming a spacer material layer over the semiconductor substrate; and
    performing an etch-back process.

8. The method for forming a fine pattern of a semiconductor device according to claim 1, wherein the removing-the-sacrificial-pattern is performed by a wet etching process.

9. The method for forming a fine pattern of a semiconductor device according to claim 1, wherein the gate material layer is disposed between a hard mask layer and the semiconductor substrate.

10. A method for forming a fine pattern of a semiconductor device, comprising:
    forming a first hard mask layer over a semiconductor substrate:
    forming an etching barrier film over the first hard mask layer;
    forming a sacrificial film over the etching barrier film;
    forming a second hard mask layer over the sacrificial film;
    patterning the second hard mask layer to form a second hard mask pattern such that a fine pattern is defined by a spacer region;
    etching the sacrificial film with the second hard mask pattern to form a sacrificial pattern;
    removing the second hard mask pattern to form a spacer on sidewalls of the sacrificial pattern;
    removing the sacrificial pattern to form a spacer pattern;
    forming a photoresist pattern that defines a dummy pattern for forming a pad in an outer region of the spacer pattern;

etching the etching barrier film and the first hard mask layer using the spacer pattern and the photoresist pattern as a mask; and removing the spacer pattern, the photoresist pattern and the etching barrier film to form a first hard mask pattern that defines the fine pattern.

11. The method for forming a fine pattern of a semiconductor device according to claim 10, wherein at least one end portion of the second hard mask pattern is curved at a predetermined angle.

12. The method for forming a fine pattern of a semiconductor device according to claim 10, wherein the forming a spacer includes:

forming a spacer material layer over the semiconductor substrate; and performing an etch-back process.

13. The method for forming a fine pattern of a semiconductor device according to claim 10, wherein the removing-the-sacrificial-pattern is performed by a wet etching process.

14. The method for forming a fine pattern of a semiconductor device according to claim 10, wherein the forming-a-spacer-pattern includes:

obtaining a spacer pattern including two adjacent line-type spacer patterns which are connected with each other;

forming a second photoresist pattern that exposes both end portions of a line pattern formed by the spacer over the semiconductor substrate; and etching the exposed spacer using the second photoresist pattern as a mask to separate the connected spacer patterns.

15. The method for forming a fine pattern of a semiconductor device according to claim 10, further comprising forming an alignment key or an overlay vernier pattern in a scribe lane while forming the spacer pattern.

16. The method for forming a fine pattern of a semiconductor device according to claim 10, wherein a photoresist pattern of the peripheral circuit region is formed using a positive resist.

17. The method for forming a fine pattern of a semiconductor device according to claim 10, wherein a photoresist pattern of the peripheral circuit region is formed using a negative resist.

* * * * *

UNITED STATES PATENT AND TRADEMARK OFFICE
CERTIFICATE OF CORRECTION

PATENT NO. : 7,651,950 B2
APPLICATION NO. : 12/165388
DATED : January 26, 2010
INVENTOR(S) : Keun Do Ban It is certified that error appears in the above-identified patent and that said Letters Patent is hereby corrected as shown below:

In the Claims, Claim 1 should read:

1. A method for forming a fine pattern of a semiconductor device, comprising:

defining a cell region and a peripheral circuit region of a semiconductor substrate;

forming a gate material layer over the semiconductor substrate;

forming a sacrificial pattern over the gate material layer in the cell region:

forming a spacer on sidewalls of the sacrificial pattern, wherein the spacer is formed by:

forming a spacer pattern including two adjacent line-type spacer patterns which are connected with each other, forming a first photoresist pattern that exposes both end portions of a line pattern formed by the spacer over the semiconductor substrate, and etching the exposed spacer using the first photoresist pattern as a mask to separate the connected spacer patterns, removing the sacrificial pattern;

forming a ~~mask pattern~~second photoresist pattern that defines a peripheral circuit pattern over the gate material layer in the peripheral circuit region; and patterning the gale material layer of the cell region and the peripheral circuit region with the spacer pattern and[[ a]] the second photoresist pattern to obtain a cell pattern and a peripheral circuit pattern.

Signed and Sealed this
Fourth Day of June, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 7,651,950 B2
APPLICATION NO. : 12/165388
DATED : January 26, 2010
INVENTOR(S) : Keun Do Ban It is certified that error appears in the above-identified patent and that said Letters Patent is hereby corrected as shown below:

In the Claims, Column 5, line 55 - Column 6, line 14, Claim 1 should read:

1. A method for forming a fine pattern of a semiconductor device, comprising:

defining a cell region and a peripheral circuit region of a semiconductor substrate;

forming a gate material layer over the semiconductor substrate;

forming a sacrificial pattern over the gate material layer in the cell region:

forming a spacer on sidewalls of the sacrificial pattern, wherein the spacer is formed by:

forming a spacer pattern including two adjacent line-type spacer patterns which are connected with each other, forming a first photoresist pattern that exposes both end portions of a line pattern formed by the spacer over the semiconductor substrate, and etching the exposed spacer using the first photoresist pattern as a mask to separate the connected spacer patterns, removing the sacrificial pattern;

forming a ~~mask pattern~~second photoresist pattern that defines a peripheral circuit pattern over the gate material layer in the peripheral circuit region; and patterning the gale material layer of the cell region and the peripheral circuit region with the spacer pattern and[[ a]] the second photoresist pattern to obtain a cell pattern and a peripheral circuit pattern.

This certificate supersedes the Certificate of Correction issued June 4, 2013.

Signed and Sealed this
Second Day of July, 2013

Teresa Stanek Rea
*Acting Director of the United States Patent and Trademark Office*